United States Patent
Kwon et al.

(10) Patent No.: US 9,972,580 B2
(45) Date of Patent: May 15, 2018

(54) SEMICONDUCTOR PACKAGE AND METHOD FOR FABRICATING THE SAME

(71) Applicant: SAMSUNG ELECTRONICS CO., LTD., Suwon-si, Gyeonggi-do (KR)

(72) Inventors: Yonghwan Kwon, Suwon-si (KR); Seung-Kwan Ryu, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/345,779

(22) Filed: Nov. 8, 2016

(65) Prior Publication Data
US 2017/0194266 A1    Jul. 6, 2017

(30) Foreign Application Priority Data
Dec. 31, 2015    (KR) .................. 10-2015-0191285

(51) Int. Cl.
*H01L 23/00* (2006.01)
*H01L 21/3105* (2006.01)
(Continued)

(52) U.S. Cl.
CPC ...... *H01L 23/562* (2013.01); *H01L 21/31058* (2013.01); *H01L 21/565* (2013.01); *H01L 23/3121* (2013.01); *H01L 23/5386* (2013.01); *H01L 23/5389* (2013.01); *H01L 24/19* (2013.01); *H01L 24/20* (2013.01);
(Continued)

(58) Field of Classification Search
CPC ............. H01L 23/562; H01L 21/31058; H01L 21/565; H01L 23/3121; H01L 23/5386; H01L 23/5389; H01L 24/19; H01L 24/20; H01L 24/32; H01L 24/73; H01L 24/96; H01L 24/97
See application file for complete search history.

(56) References Cited

U.S. PATENT DOCUMENTS 7,192,805 B2 * 3/2007 Jobetto ................ H01L 21/561
257/620
9,123,673 B2    9/2015 Li et al.
(Continued)

FOREIGN PATENT DOCUMENTS

KR    101055453    8/2011
KR    101159807    6/2012
(Continued)

*Primary Examiner* — Long Pham
(74) *Attorney, Agent, or Firm* — F. Chau & Associates, LLC

(57) ABSTRACT

A semiconductor package includes a stack structure, a mold layer disposed on at least one sidewall of the stack structure, a redistribution line electrically connected to the stack structure, and an external terminal electrically connected to the redistribution line. The stack structure includes a semiconductor chip having an active surface and a non-active surface opposite to the active surface. A dummy substrate is disposed on the non-active surface of the semiconductor chip. An adhesive layer is disposed between the dummy substrate and the semiconductor chip. The mold layer includes a top surface adjacent to the redistribution line and a bottom surface opposite to the top surface. The dummy substrate is exposed through the bottom surface of the mold layer.

14 Claims, 12 Drawing Sheets

(51) Int. Cl.
H01L 21/56 (2006.01)
H01L 23/31 (2006.01)
H01L 23/538 (2006.01)

(52) U.S. Cl.
CPC .............. *H01L 24/32* (2013.01); *H01L 24/73* (2013.01); *H01L 24/96* (2013.01); *H01L 24/97* (2013.01); *H01L 21/568* (2013.01); *H01L 2224/04105* (2013.01); *H01L 2224/12105* (2013.01); *H01L 2224/29147* (2013.01); *H01L 2224/32225* (2013.01); *H01L 2224/32245* (2013.01); *H01L 2224/73267* (2013.01); *H01L 2224/92244* (2013.01); *H01L 2224/94* (2013.01); *H01L 2224/97* (2013.01); *H01L 2924/18162* (2013.01); *H01L 2924/3511* (2013.01); *H01L 2924/3512* (2013.01); *H01L 2924/37001* (2013.01)

(56) References Cited

U.S. PATENT DOCUMENTS

| | | |
|---|---|---|
| 2009/0155984 A1 | 6/2009 | Kim et al. |
| 2016/0049350 A1* | 2/2016 | Matsuda ............. H01L 23/3736 257/717 |
| 2017/0194249 A1* | 7/2017 | Chen .................. H01L 23/5226 |

FOREIGN PATENT DOCUMENTS

| | | |
|---|---|---|
| KR | 101199487 | 11/2012 |
| KR | 1020150093878 | 8/2015 |

* cited by examiner

SEMICONDUCTOR PACKAGE AND METHOD FOR FABRICATING THE SAME

CROSS-REFERENCE TO RELATED APPLICATION

This U.S. non-provisional patent application claims priority under 35 U.S.C. § 119 to Korean Patent Application No. 10-2015-0191285, filed on Dec. 31, 2015, in the Korean Intellectual Property Office, the disclosure of which is incorporated by reference herein in its entirety.

TECHNICAL FIELD

Exemplary embodiments of the present inventive concept relate to a semiconductor package, and more particularly to a method of fabricating the same.

DISCUSSION OF RELATED ART

A process of grinding a semiconductor chip may be included in a process of manufacturing a semiconductor chip or a semiconductor package. During the grinding process, a scratch or crack may occur on a semiconductor chip and/or a semiconductor chip may be contaminated by a contaminant. Thus, a yield of semiconductor chips may be reduced.

SUMMARY

Exemplary embodiments of the present inventive concept may provide a semiconductor package including semiconductor chips not damaged or contaminated, and a method for fabricating the same.

Exemplary embodiments of the present inventive concept may provide a semiconductor package and a method of fabricating the semiconductor package with an increased semiconductor package yield.

Exemplary embodiments of the present inventive concept may provide a semiconductor package having increased electrical and/or mechanical characteristics and a method for fabricating the same.

According to an exemplary embodiment of the present invention, a semiconductor package includes a stack structure, a mold layer disposed on at least one sidewall of the stack structure, a redistribution line electrically connected to the stack structure, and an external terminal electrically connected to the redistribution line. The stack structure includes a semiconductor chip having an active surface and a non-active surface opposite to the active surface. An adhesive layer is disposed on the non-active surface of the semiconductor chip. A dummy substrate is disposed on the adhesive layer. The mold layer includes a top surface adjacent to the redistribution line and a bottom surface opposite to the top surface. The dummy substrate is exposed through the bottom surface of the mold layer.

According to an exemplary embodiment of the present invention, a semiconductor package includes a stack structure including a semiconductor chip, a dummy substrate disposed below the semiconductor chip and a metallic adhesive layer disposed between the dummy substrate and the semiconductor chip. A mold layer is disposed on the first and second sidewalls of the stack structure. The mold layer has a top surface and a bottom surface opposite to the top surface. An external terminal is electrically connected to the semiconductor chip. The external terminal is disposed on the top surface of the mold layer. The semiconductor includes an active surface on which a circuit layer electrically connected to the external terminal is disposed, and a non-active surface opposite to the active surface. The dummy substrate is disposed on the non-active surface of the semiconductor chip. The dummy substrate is exposed through the bottom surface of the mold layer.

According to an exemplary embodiment of the present invention, a method for fabricating a semiconductor package includes providing a plurality of stack structures. Each of the stack structures includes a dummy substrate and a semiconductor chip disposed on the dummy substrate. A mold layer is formed on first and second sidewalls of the stack structures. A plurality of redistribution lines electrically connected to the semiconductor chips is formed. A plurality of external terminals electrically connected to the redistribution lines is formed. At least one of the plurality of external terminals is disposed on the mold layer. Grinding is performed on the mold layer to expose the dummy substrates. Dicing is performed on the ground mold layer to form a package that includes the stack structure including the diced mold layer disposed on first and second sidewalls of the stack structure and the external terminal disposed on the diced mold layer.

According to an exemplary embodiment of the present invention, a semiconductor package includes a semiconductor chip including a top surface, a circuit layer disposed on the top surface, and a bottom surface opposite to the top surface. An adhesive layer covers the bottom surface of the semiconductor chip. A mold layer is disposed on at least one sidewall of the semiconductor chip and the adhesive layer. A redistribution line is electrically connected to the circuit layer of the semiconductor chip. The redistribution line is disposed on the top surface of the semiconductor chip and extends onto the mold layer. An external terminal is electrically connected to the redistribution line.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

It will be understood that when an element such as a layer, region or substrate is referred to as being "on" another element, it may be directly on the other element or intervening elements may be present. The relative thicknesses and positioning of molecules, layers, regions and/or structural elements may be reduced or exaggerated for clarity.

Figure 1A:
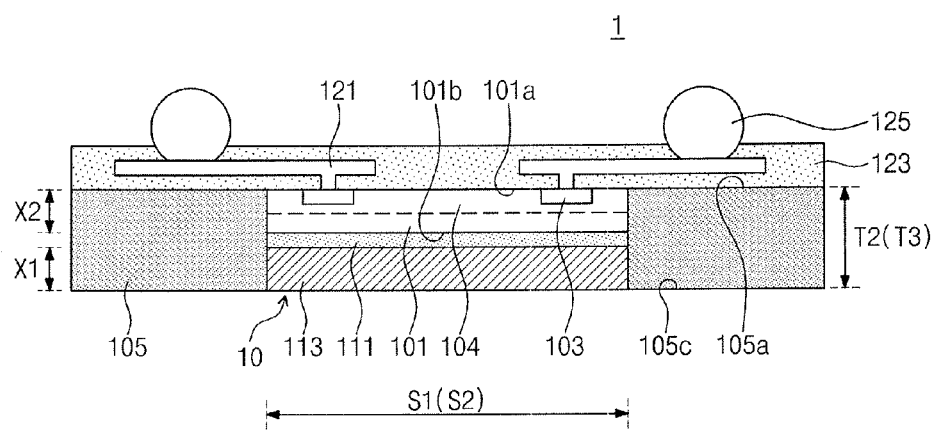
FIG. 1A is a cross-sectional view illustrating a semiconductor package according to some exemplary embodiments of the present inventive concept.

FIG. 1A is a cross-sectional view illustrating a semiconductor package according to some exemplary embodiments of the present inventive concept.

Referring to FIG. 1A, a semiconductor package 1 may include a stack structure 10 including a semiconductor chip 101, a redistribution line 121 electrically connected to the semiconductor chip 101, an external terminal 125 electrically connected to the redistribution line 121, and a mold layer 105 disposed on at least one sidewall of the stack structure 10. In some exemplary embodiments of the present inventive concept, the semiconductor package 1 need not include a package substrate such as a printed circuit board (PCB).

The semiconductor chip 101 may have an active surface 101a. A circuit layer 104 may be disposed on the active surface 101a. The semiconductor chip 101 may include a non-active surface 101b which is opposite to the active surface 101a. The active surface 101a may include one or more chip pads 103 electrically connected to the circuit layer 104. In some exemplary embodiments of the present inventive concept, the chip pads 103 may be disposed in an edge region of the active surface 101a of the semiconductor chip 101. In some exemplary embodiments of the present inventive concept, at least one chip pad 103 may be disposed in a central region of the active surface 101a of the semiconductor chip 101. In some exemplary embodiments of the present inventive concept, the chip pads 103 may be disposed on substantially an entire region of the active surface 101a of the semiconductor chip 101. The active surface 101a of the semiconductor chip 101 may be coplanar with a top surface 105a of the mold layer 105. For example, the semiconductor chip 101 may be a memory chip, a logic chip, or a combination thereof.

The stack structure 10 may include a dummy substrate 113 disposed on the non-active surface 101b of the semiconductor chip 101. An adhesive layer 111 may be disposed between the dummy substrate 113 and the non-active surface 101b. At least one of the adhesive layer 111 or the dummy substrate 113 may include a conductive, non-conductive or semiconductor material. For example, the adhesive layer 111 may include a metal paste (e.g., a copper paste), and the dummy substrate 113 may include a silicon substrate. The dummy substrate 113 may be exposed through a bottom surface 105c of the mold layer 105. A thickness T2 of the stack structure 10 may be equal or similar to a thickness T3 of the mold layer 105.

The metallic adhesive layer 111 may act as a heat dissipation layer, and thus heat generated from the semiconductor chip 101 may be effectively dissipated. The dummy substrate 113 may reduce or prevent an occurrence of a scratch or a crack in the semiconductor chip 101 which may occur during a fabrication process, as described below in more detail with reference to FIG. 2I. The dummy substrate 113 may reduce or prevent warpage of the semiconductor package 1. The dummy substrate 113 and the semiconductor chip 101 may have substantially the same size or may have sizes different from each other. For example, a size S1 (e.g., a width) of the dummy substrate 113 may be equal or similar to a size S2 (e.g., a width) of the semiconductor chip 101. A thickness X1 of the dummy substrate 113 may be equal to or different from a thickness X2 of the semiconductor chip 101.

The redistribution line 121 may be electrically connected to the chip pad 103. The redistribution line 121 may extend beyond a sidewall of the semiconductor chip 101 onto the mold layer 105. The external terminal 125 may be connected to an end portion of the redistribution line 121. The semiconductor package 1 may have a fan-out structure in which the external terminals 125 are arranged around the semiconductor chip 101. A protection layer 123 may cover the redistribution line 121, the active surface 101a of the semiconductor chip 101, and the top surface 105a of the mold layer 105.

Figure 1B:
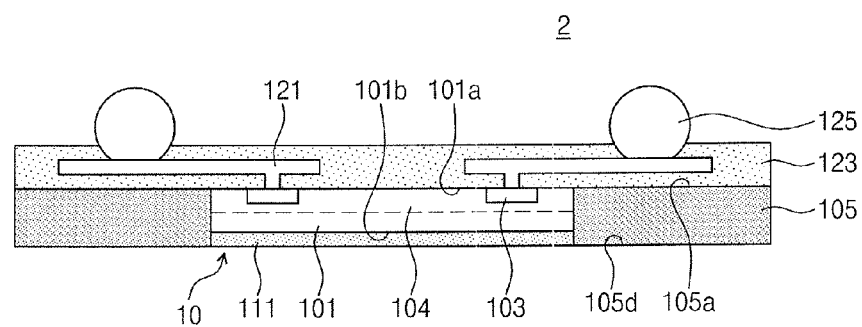
FIG. 1B is a cross-sectional view illustrating a semiconductor package according to some exemplary embodiments of the present inventive concept.
Figure 1C:
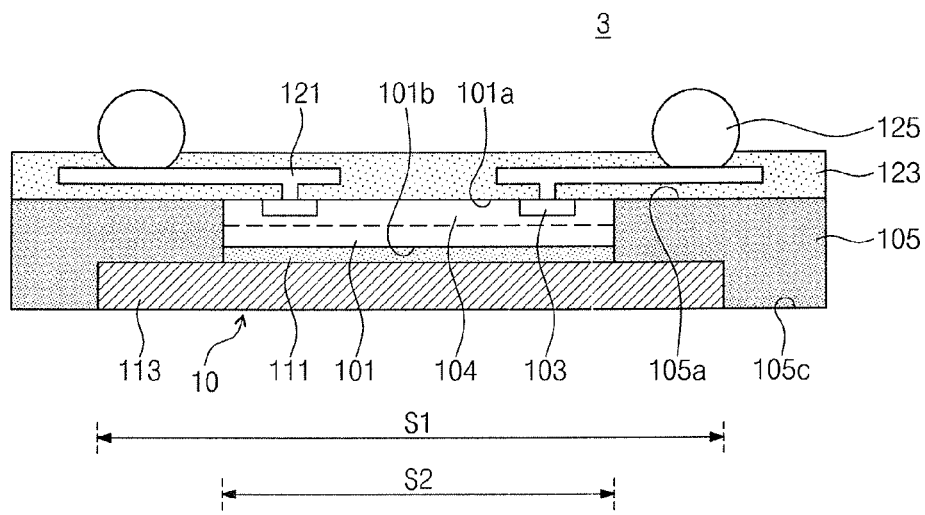
FIG. 1C is a cross-sectional view illustrating a semiconductor package according to some exemplary embodiments of the present inventive concept.
Figure 1D:
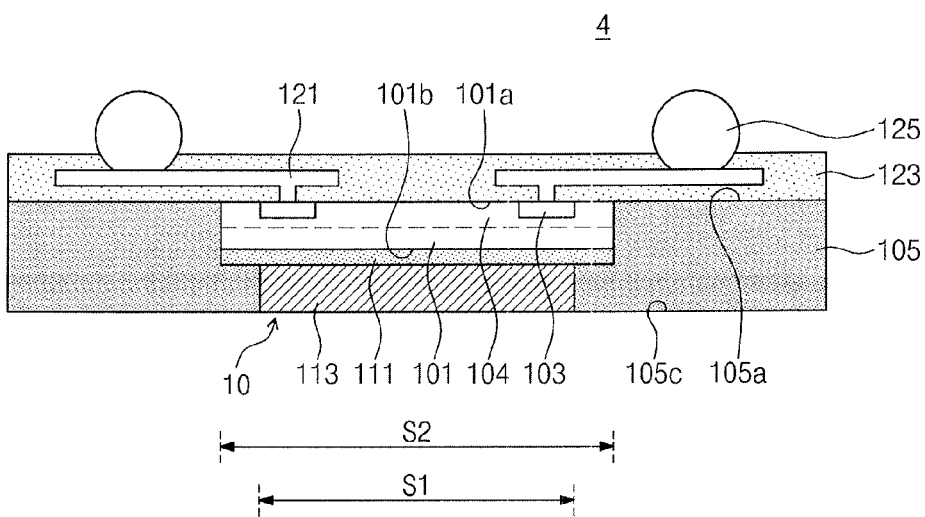
FIG. 1D is a cross-sectional view illustrating a semiconductor package according to some exemplary embodiments of the present inventive concept.

FIGS. 1B, 1C, and 1D are cross-sectional views illustrating semiconductor packages according to some exemplary embodiments of the present inventive concept. Descriptions of the same or similar elements and/or technical features as in the exemplary embodiment of the present inventive concept described above with reference to FIG. 1A may be omitted or mentioned briefly. Differences between the exemplary embodiment of the present inventive concept described above with reference to FIG. 1A and the exemplary embodiments of the present inventive concept described with reference to FIGS. 1B, 1C and 1D may be described.

Referring to FIG. 1B, a semiconductor package 2 may include the stack structure 10 including the semiconductor chip 101 and the adhesive layer 111. The semiconductor package 2 need not include the dummy substrate 113. The adhesive layer 111 may be exposed through a bottom surface 105d of the mold layer 105. When the adhesive layer 111 includes a metallic material, the adhesive layer 111 may act as a heat dissipation layer and may act as a substrate, which may reduce or eliminate warpage of the semiconductor package 2.

Referring to FIG. 1C, a semiconductor package 3 may include the dummy substrate 113 of which a size S1 is greater than the size S2 of the semiconductor chip 101. The dummy substrate 113 may be exposed through the bottom surface 105c of the mold layer 105. A sidewall of the dummy substrate 113 need not reach the sidewall of the mold layer 105. For example, the sidewall of the dummy substrate 113 may be covered by the mold layer 105.

Referring to FIG. 1D, a semiconductor package 4 may include the dummy substrate 113 of which a size S1 is smaller than the size S2 of the semiconductor chip 101. The size S1 of the dummy substrate 113 may be smaller than the size S2 of the semiconductor chip 101, and thus warpage of the semiconductor package 4 may be reduced or eliminated.

FIGS. 2A, 2C, 2D, 2E, 2F, 2G, 2H, 2I and 2J are cross-sectional views illustrating a method for fabricating a semiconductor package according to some exemplary embodiments of the present inventive concept. FIG. 2B is a cross-sectional view illustrating another embodiment of FIG. 2A. FIG. 2K is a cross-sectional view illustrating another embodiment of FIG. 2J.

Figure 2A:
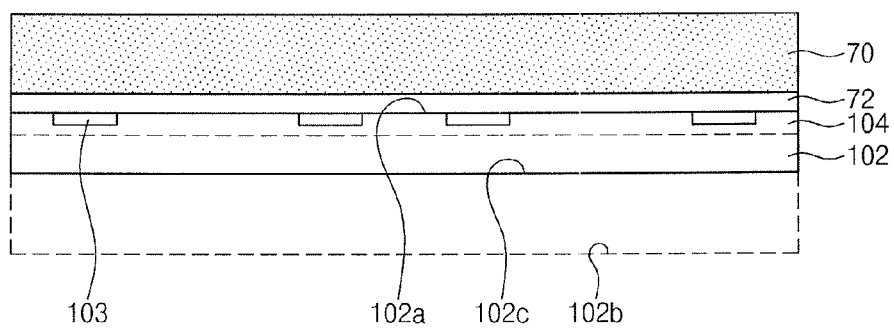
FIGS. 2A, 2C, 2D, 2E, 2F, 2G, 2H, 2I and 2J are cross-sectional views illustrating a method for fabricating a semiconductor package according to some exemplary embodiments of the present inventive concept.
Figure 2B:
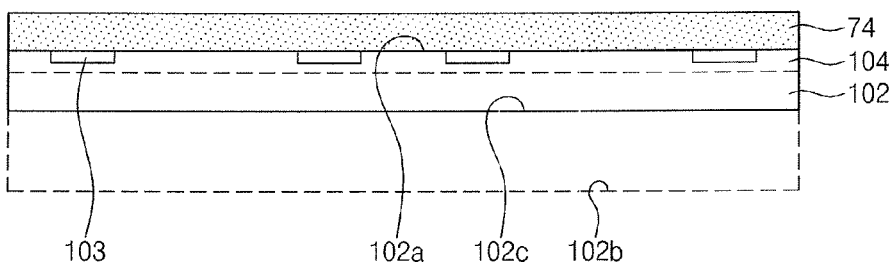
FIG. 2B is a cross-sectional view illustrating another embodiment of FIG. 2A.

Referring to FIG. 2A, a wafer 102 having a first surface 102a and a second surface 102b opposite to each other may be thinned. The wafer 102 may be, for example, a silicon wafer that includes the circuit layer 104 and chip pads 103 electrically connected to the circuit layer 104. A grinding, chemical mechanical polishing (CMP), or etching process may be performed on the second surface 102b of the wafer 102 to thin the wafer 102. A third surface 102c that is closer to the first surface 102a than the second surface 102b is may be exposed by the thinning process.

A support substrate 70 may be bonded to the first surface 102a of the wafer 102 by an adhesive layer 72 (e.g., a die attach film (DAF)). The support substrate 70 may support the wafer 102 and may protect the circuit layer 104 during the thinning process. For example, the support substrate 70 may be a silicon wafer or glass substrate of which a size is equal or similar to that of the wafer 102. In some exemplary embodiments of the present inventive concept, a protection film 74 may be disposed on the first surface 102a of the wafer 102. The protection film 74 may protect the circuit layer 104 from damage or contamination which may be caused during the thinning process.

Figure 2C:
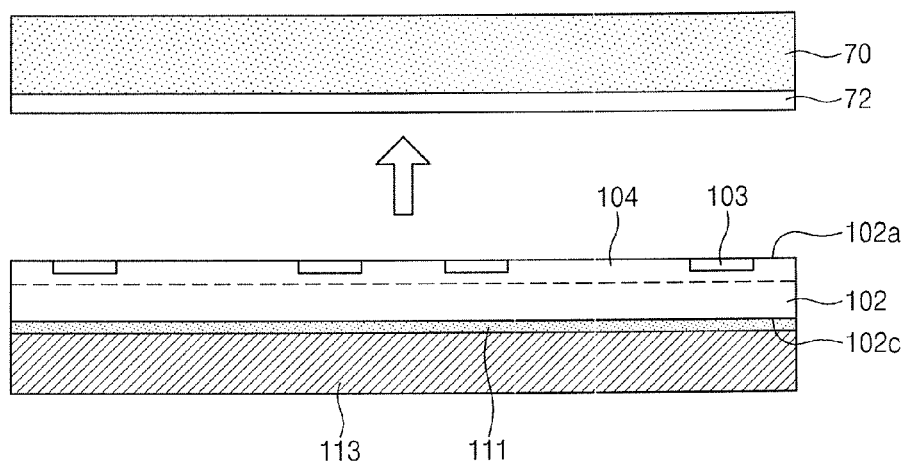

Referring to FIG. 2C, the dummy substrate 113 may be bonded to the third surface 102c of the wafer 102 with the adhesive layer 111 disposed between the dummy substrate 113 and the third surface 102c. At least one of the adhesive layer 111 and the dummy substrate 113 may include a conductive, non-conductive or semiconductor material. For example, the adhesive layer 111 may include a metal paste (e.g., a copper paste), and the dummy substrate 113 may include a silicon wafer. A size (e.g., a diameter) of the dummy substrate 113 may be equal or similar to that of the wafer 102. The support substrate 70 and the adhesive layer 72 may be removed from the wafer 102 after the dummy substrate 113 is bonded to the wafer 102.

Figure 2D:
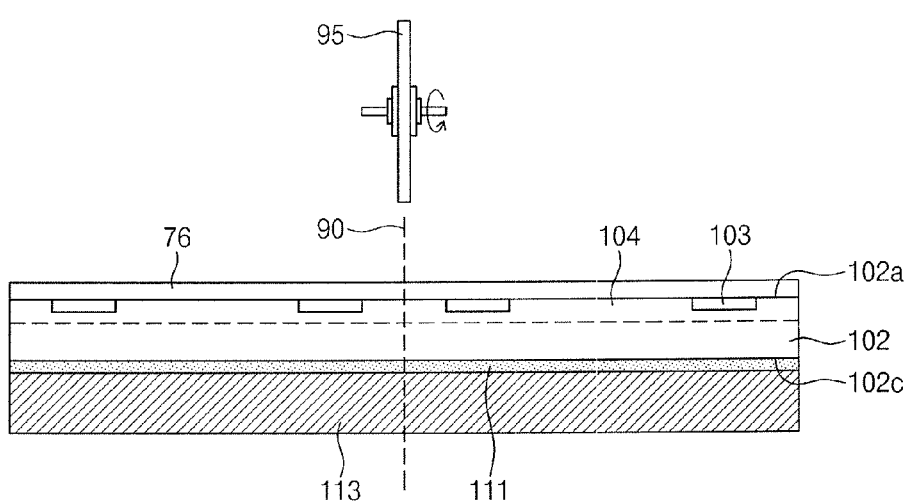

Referring to FIG. 2D, the wafer 102 to which the dummy substrate 113 is bonded may be diced along a scribe lane 90. In some exemplary embodiments of the present inventive concept, when the dicing process is performed, a protection film 76 may be disposed on the first surface 102a of the wafer 102. The protection film 76 may protect the circuit layer 104 from damage or contamination which may be caused during the dicing process. In some exemplary embodiments of the present inventive concept, the dicing process may be performed using a cutting apparatus (e.g., a blade 95). In some exemplary embodiments of the present inventive concept, the wafer 102 may be diced by a laser cutting process.

Figure 2E:
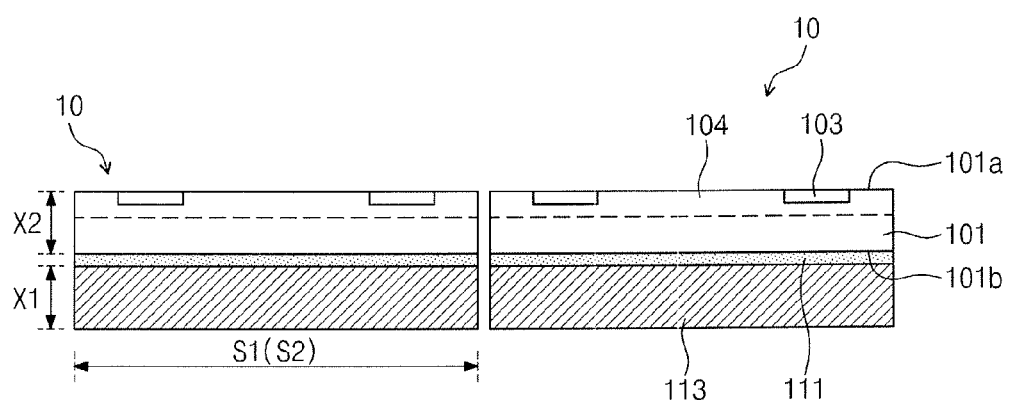

Referring to FIG. 2E, the wafer 102 and the dummy substrate 113 may be divided into a plurality of stack structures 10 by the dicing process. Each of the stack structures 10 may include the semiconductor chip 101 to which the dummy substrate 113 is bonded using the adhesive layer 111. The dummy substrate 113 of the stack structure 10 may be a corresponding one of portions of the dummy substrate 113 separated from each other by the dicing process. In each of the stack structures 10, a size S1 (e.g., a width) of the dummy substrate 113 may be equal or similar to a size S2 (e.g., a width) of the semiconductor chip 101. A thickness X1 of the dummy substrate 113 may be substantially equal to or different from a thickness X2 of the semiconductor chip 101.

The semiconductor chip 101 may include the active surface 101a corresponding to the first surface 102a of the wafer 102 and the non-active surface 101b corresponding to the third surface 102c of the wafer 102. For example, the semiconductor chip 101 may be a memory chip, a logic chip, or a combination thereof.

Figure 2F:
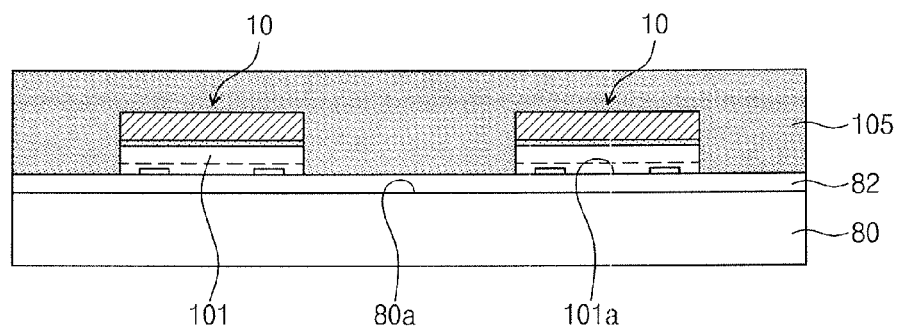

Referring to FIG. 2F, a plurality of the stack structures 10 may be bonded to a top surface 80A of a support substrate 80 by an adhesive layer 82 such as a die attach film (DAF). The support substrate 80 may include a silicon wafer or a glass substrate. The stack structures 10 may be arranged along the top surface 80a of the support substrate 80 and may be spaced apart from each other. The stack structure 10 may be disposed on the support substrate 80. The active surface 101a of the semiconductor chip 101 may face the support substrate 80. The mold layer 105 covering the stack structures 10 may be formed on the support substrate 80 after the stack structures 10 are bonded to the support substrate 80. The mold layer 105 may include, for example, an epoxy molding compound (EMC).

Figure 2G:
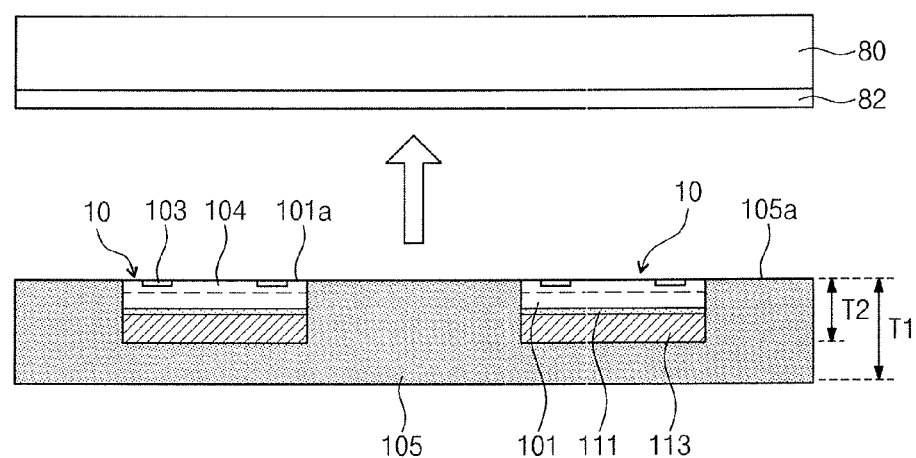

Referring to FIG. 2G, the support substrate 80 and the adhesive layer 82 may be removed from the mold layer 105. Thus, the stack structures 10 may be exposed. For example, the active surface 101a of the semiconductor chip 101 may be exposed, and thus the circuit layer 104 and the chip pads 103 may be exposed. The active surface 101a of the semiconductor chip 101 may be coplanar with the top surface 105a of the mold layer 105. A thickness T1 of the mold layer 105 may be greater than a thickness T2 of the stack structure 10.

Figure 2H:
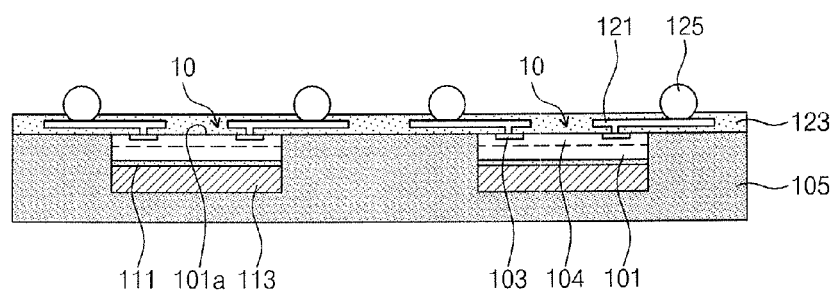

Referring to FIG. 2H, the redistribution line 121 may be connected to the chip pad 103. The redistribution line 121 may be covered by the protection layer 123 covering the active surface 101a of the semiconductor chip 101 and the mold layer 105. In some exemplary embodiments of the present inventive concept, the protection layer 123 may include a polymer such as polyimide (PI), polybenzoxazole (PBO), or benzocyclobutene (BCB). In some exemplary embodiments of the present inventive concept, the protection layer 123 may include a silicon oxide layer or a silicon nitride layer. The protection layer 123 may have a multi-layer or a single-layer structure. The external terminal (e.g., a solder ball) 125 may be electrically connected to the redistribution line 121. The redistribution line 121 may extend beyond a sidewall of the semiconductor chip 101. The external terminal 125 may be adjacent to an end portion of the redistribution line 121 extending beyond the sidewall of the semiconductor chip 101. The external terminal 125 may be disposed outside the semiconductor chip 101.

Figure 2I:
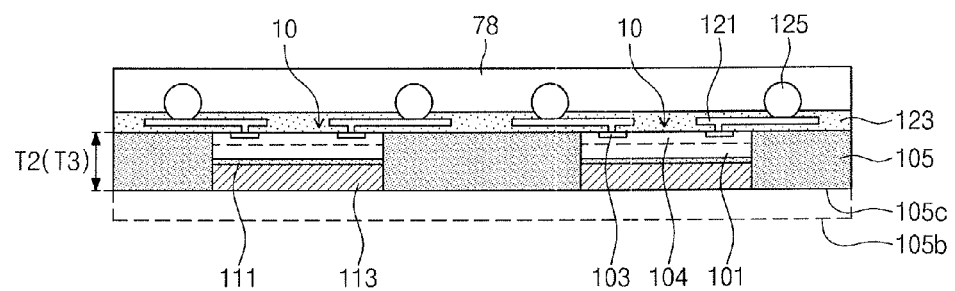

Referring to FIG. 2I, a back grinding process may be performed on the bottom surface 105b of the mold layer 105. In some exemplary embodiments of the present inventive concept, a protection film 78 protecting the external terminal 125 may be bonded to the protection layer 123. The dummy substrate 113 may be exposed through the bottom surface 105c of the mold layer 105, which may be recessed by the back grinding process. A scratch or crack may occur in the dummy substrate 113 and/or in a filler included in the mold layer 105 during the back grinding process. However, since the semiconductor chip 101 is not exposed, a scratch or crack might not occur in the semiconductor chip 101. Even though contamination may occur in the scratch or crack of the dummy substrate 113, the semiconductor chip 101 may be protected from contamination or damage. A thickness T3 of the ground mold layer 105 may be equal or similar to the thickness T2 of the stack structure 10.

Figure 2J:
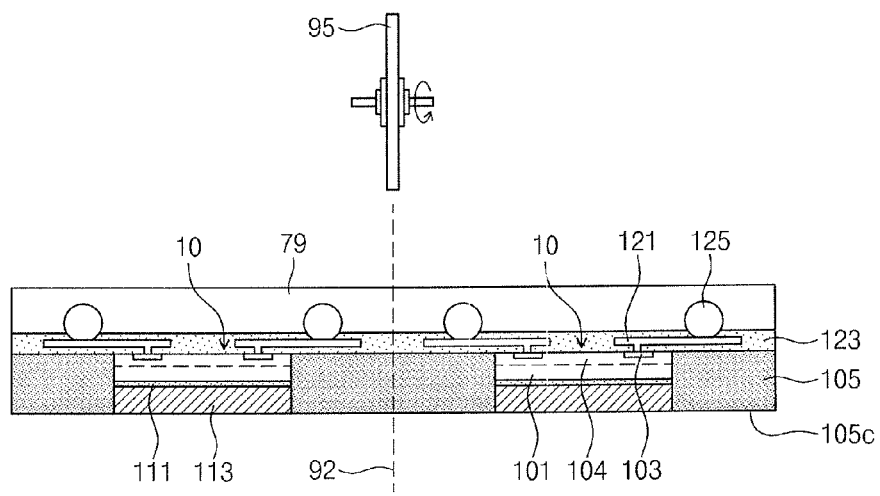
Figure 2K:
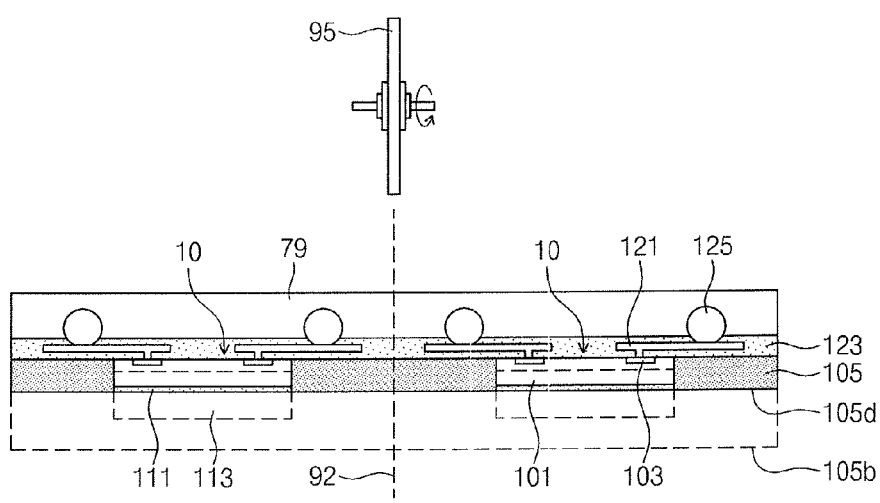
FIG. 2K is a cross-sectional view illustrating another embodiment of FIG. 2J.

Referring to FIG. 2J, the mold layer 105 may be diced along a scribe lane 92. In some exemplary embodiments of the present inventive concept, the dicing process may be performed using a cutting apparatus (e.g., the blade 95). Alternatively, the mold layer 105 may be diced by a laser cutting process. In some exemplary embodiments of the present inventive concept, when the dicing process is performed, a protection film 79 may adhere to the protection layer 123 and may protect the semiconductor chip 101 and/or the external terminal 125 from damage or contamination which may be caused during the dicing process. Alternatively, the protection film 78 used in the back grinding process need not be removed but may be used during the dicing process performed on the mold layer 105. The semiconductor package 1 may be fabricated by the dicing process of the mold layer 105.

Referring to FIG. 2K, at least a portion of the dummy substrate 113 may be removed by over-grinding during the back grinding process performed on the bottom surface 105*b* of the mold layer 105. In some exemplary embodiments of the present inventive concept, the dummy substrate 113 may be substantially completely removed by the over-grinding, and thus the adhesive layer 111 may be exposed through a recessed bottom surface 105*d* of the mold layer 105. The adhesive layer 111 may be a metallic adhesive layer. When the over-grinding is performed, the metallic adhesive layer 111 may act as a crack stopper or a grinding stopper. After performing the over-grinding the mold layer 105 may be diced to fabricate the semiconductor package 2.

FIGS. 3A, 3B, 3C, 3D, 3E and 3F are cross-sectional views illustrating a method for fabricating a semiconductor package according to some exemplary embodiments of the present inventive concept. FIG. 3G is a cross-sectional view illustrating another embodiment of FIG. 3F.

Figure 3A:
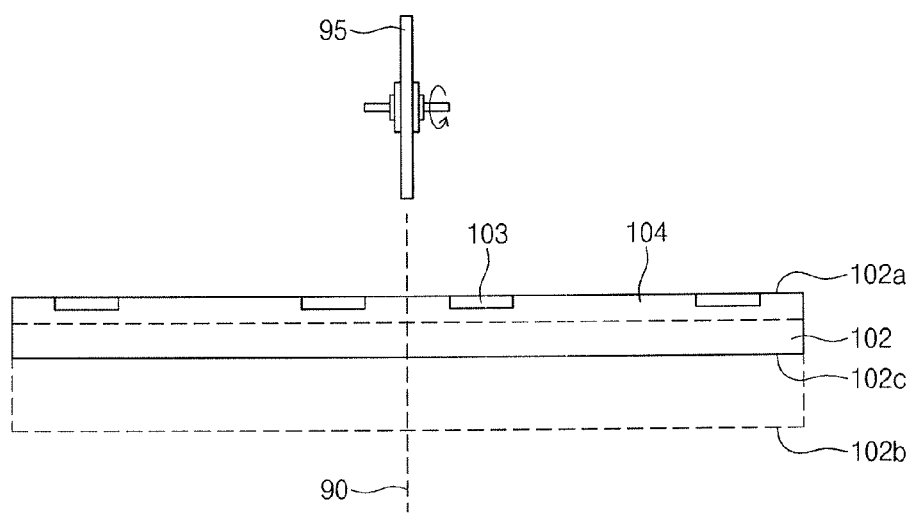
FIGS. 3A, 3B, 3C, 3D, 3E and 3F are cross-sectional views illustrating a method for fabricating a semiconductor package according to some exemplary embodiments of the present inventive concept.

Referring to FIG. 3A, the wafer 102 may be provided. The wafer 102 may include the first surface 102*a*, the second surface 102*b* opposite to the first surface 102*a*, the circuit layer 104, and chip pads 103. A grinding, CMP, or etching process may be performed on the second surface 102*b* of the wafer 102 to thin the wafer 102. Next, the wafer 102 may be diced along a scribe lane 90. The dicing process of the wafer 102 may be performed using a cutting apparatus such as the blade 95. The process of thinning the wafer 102 may be performed in a state in which the support substrate 70 is bonded to the first surface 102*a* of the wafer 102 with the adhesive layer 72 disposed between the support substrate and the first surface 102*a*. The process of thinning the wafer 102 may be performed in a state in which the protection film 74 is bonded to the first surface 102*a* of the wafer 102. The third surface 102*c* of the wafer 102 may be exposed by the process of thinning the wafer 102. A distance between the third surface 102*c* and the first surface 102*a* may be smaller than a distance between the second surface 102*b* and the first surface 102*a*. The dicing process of the wafer 102 may be performed in a state in which the protection film 76 protecting the circuit layer 104 is bonded to the first surface 102*a* of the wafer 102.

Figure 3B:
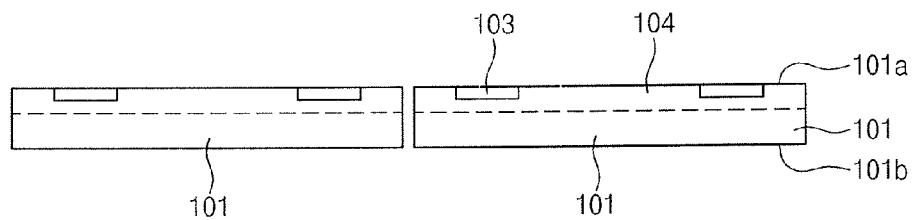

Referring to FIG. 3B, the wafer 102 may be divided into a plurality of semiconductor chips 101 by the dicing process. The semiconductor chip 101 may include the active surface 101*a* and the non-active surface 101*b* opposite to the active surface 101*a*. For example, the semiconductor chip 101 may be a memory chip, a logic chip, or a combination thereof.

Figure 3C:
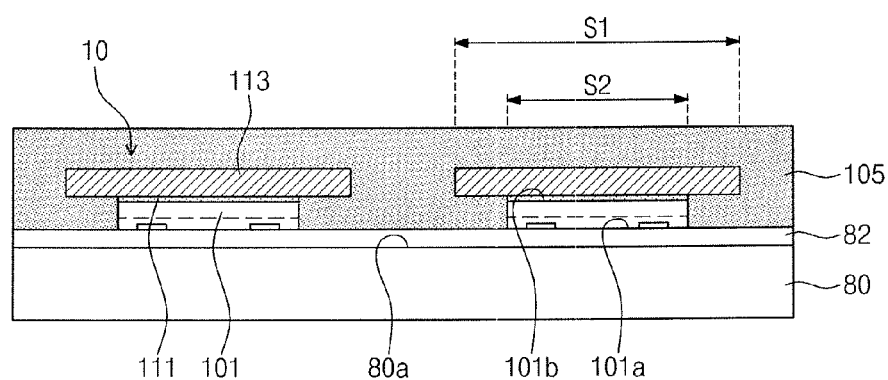

Referring to FIG. 3C, a plurality of the semiconductor chips 101 may be bonded to the support substrate 80 (e.g., a silicon wafer or a glass substrate) by an adhesive layer 82 such as a die attach film (DAF). The semiconductor chip 101 may be disposed on the support substrate 80 with the active surface 101*a* facing the support substrate 80. A dummy substrate 113 may be bonded to the non-active surface 101*b* of each of the semiconductor chips 101 with the adhesive layer 111 disposed between the dummy substrate 113 and the non-active surface 101*b*. Thus, a plurality of stack structures 10 spaced apart from each other may be disposed on a top surface 80*a* of the support substrate 80. An epoxy molding compound (EMC) may be disposed on the support substrate 80 to form the mold layer 105 molding the stack structures 10. The adhesive layer 111 may include a metal paste (e.g., a copper paste), and the dummy substrate 113 may include a silicon substrate. A size S1 (e.g., a width) of the dummy substrate 113 may be greater than a size S2 (e.g., a width) of the semiconductor chip 101.

Figure 3D:
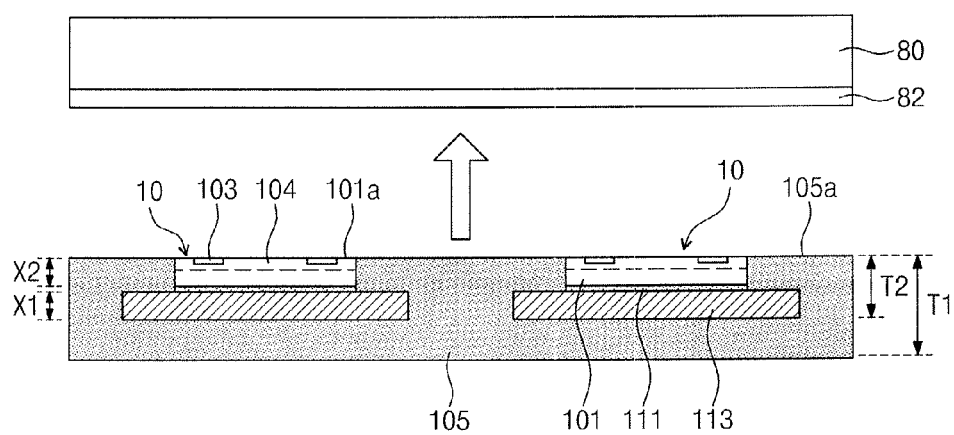

Referring to FIG. 3D, the support substrate 80 and the adhesive layer 82 may be removed from the mold layer 105 molding the stack structures 10. The stack structures 10 may be exposed by the removal of the support substrate 80 and the adhesive layer 82. For example, the active surface 101*a* of the semiconductor chip 101 may be exposed, and thus the circuit layer 104 and the chip pads 103 may be exposed. The active surface 101*a* of the semiconductor chip 101 may be coplanar with the top surface 105*a* of the mold layer 105. A thickness T1 of the mold layer 105 may be equal to or greater than a thickness T2 of the stack structure 10. A thickness X1 of the dummy substrate 113 may be equal to or different from a thickness X2 of the semiconductor chip 101.

Figure 3E:
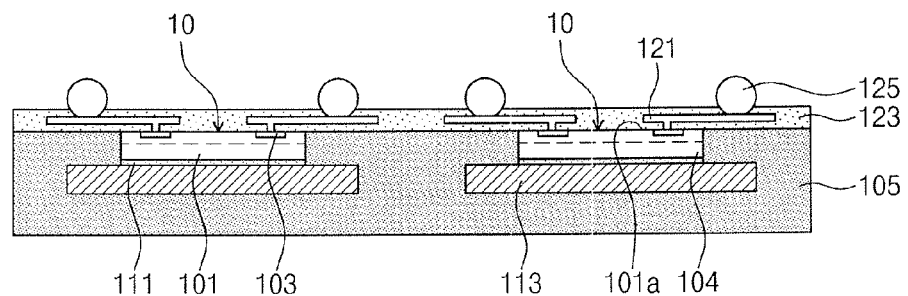

Referring to FIG. 3E, the redistribution line 121 connected to the chip pad 103 may be formed, and the protection layer 123 covering the redistribution line 121 may be formed. The external terminal (e.g., a solder ball) 125 may be formed to be electrically connected to the redistribution line 121. The external terminal 125 may be disposed outside the semiconductor chip 101.

Figure 3F:
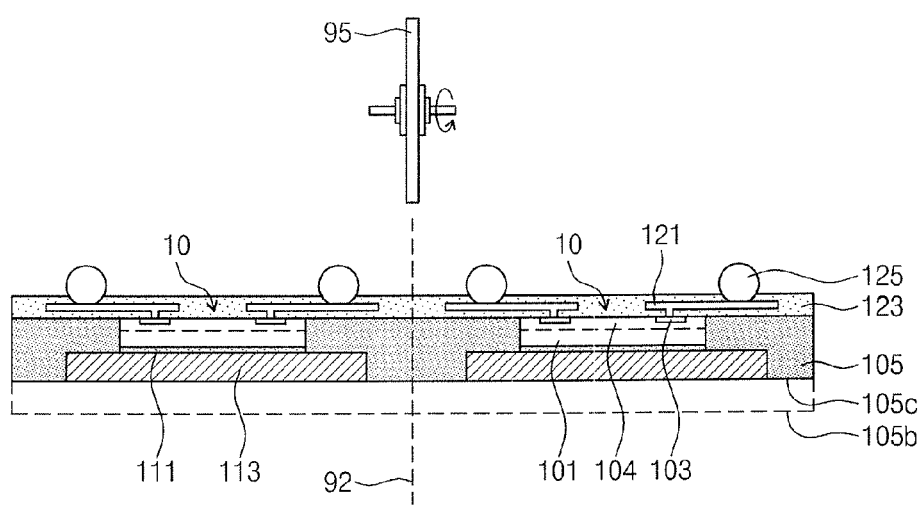
Figure 3G:
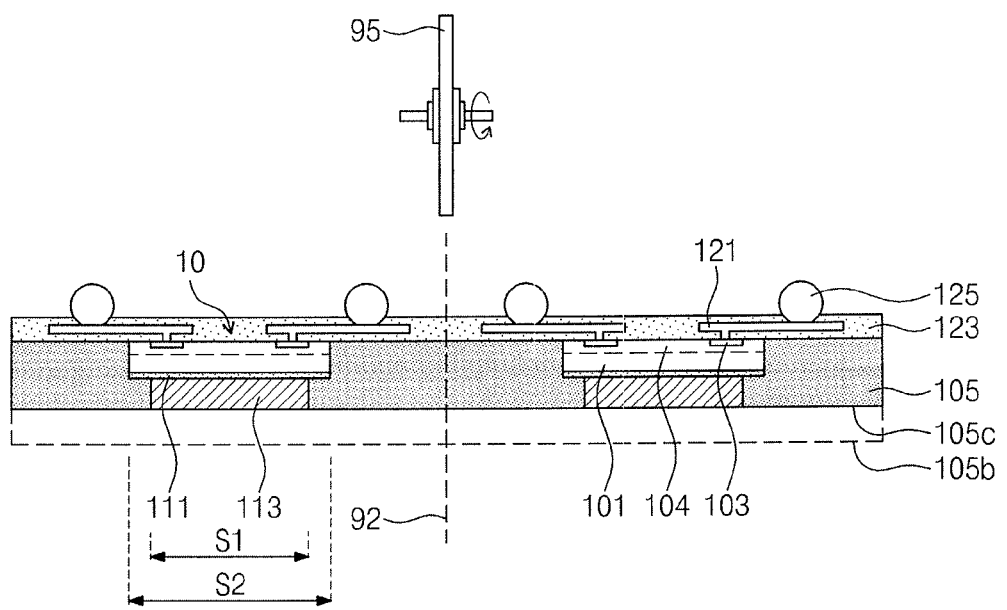
FIG. 3G is a cross-sectional view illustrating another embodiment of FIG. 3F.

Referring to FIG. 3F, a back grinding process may be performed on the bottom surface 105*b* of the mold layer 105, and the mold layer 105 may be diced along a scribe lane 92. The semiconductor package 3 may be fabricated by the back grinding process and the dicing process. The protection film 78 may adhere to the protection layer 123 when at least one of the back grinding process or the dicing process is performed.

Referring to FIG. 3G, a size S1 of the dummy substrate 113 may be smaller than the size S2 of the semiconductor chip 101 in the stack structure 10. In this case, the back grinding process and the dicing process described in more detail above with reference to FIG. 3F may be performed to fabricate the semiconductor package 4.

According to some exemplary embodiments of the present inventive concept, the dummy substrate may be bonded to the semiconductor chip, and an occurrence of a scratch or crack in the semiconductor chip may be reduced or eliminated. In addition, the dummy substrate may reduce or eliminate warpage of the semiconductor package.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:
1. A semiconductor package comprising:
 a stack structure;
 a mold layer disposed on at least one sidewall of the stack structure;
 a redistribution line electrically connected to the stack structure; and
 an external terminal electrically connected to the redistribution line,
 wherein the stack structure comprises:
 a semiconductor chip having an active surface and a non-active surface opposite to the active surface;
 an adhesive layer disposed on the non-active surface of the semiconductor chip; and
 a dummy substrate disposed on the adhesive layer,
 wherein the mold layer includes a top surface adjacent to the redistribution line and a bottom surface opposite to the top surface, wherein the mold layer is in direct contact with a side surface of the dummy substrate, and
wherein the dummy substrate is exposed through the bottom surface of the mold layer.

2. The semiconductor package of claim 1, wherein the adhesive layer includes a metal paste.

3. The semiconductor package of claim 1, wherein the redistribution line is disposed on the active surface of the semiconductor chip and extends beyond a sidewall of the semiconductor chip onto the mold layer.

4. The semiconductor package of claim 1, wherein the mold layer is in direct contact with a sidewall of the semiconductor chip,
wherein the external terminal is provided on the top surface of the mold layer,
wherein the sidewall of the semiconductor chip is perpendicular to the top surface of the mold layer, and
wherein the sidewall of the semiconductor chip is aligned with the side surface of the dummy substrate.

5. The semiconductor package of claim 1, further comprising a protection layer disposed on the redistribution line and covering the active surface of the semiconductor chip and the top surface of the mold layer.

6. The semiconductor package of claim 1, wherein a size of the dummy substrate is substantially equal to a size of the semiconductor chip.

7. The semiconductor package of claim 1, wherein a size of the dummy substrate is greater or smaller than a size of the semiconductor chip.

8. The semiconductor package of claim 1, wherein the active surface of the semiconductor chip is substantially coplanar with the top surface of the mold layer.

9. A semiconductor package comprising:
a semiconductor chip including a top surface, a circuit layer disposed on the top surface, and a bottom surface opposite to the top surface;
an adhesive layer covering the bottom surface of the semiconductor chip;
a dummy substrate positioned below the adhesive layer;
a mold layer disposed on at least one sidewall of the semiconductor chip and the adhesive layer, wherein the at least one sidewall of the semiconductor chip is aligned with a side surface of the dummy substrate, and wherein the mold layer is disposed on the side surface of the dummy substrate;
a redistribution line electrically connected to the circuit layer of the semiconductor chip, the redistribution line disposed on the top surface of the semiconductor chip and extending onto the mold layer; and
an external terminal electrically connected to the redistribution line.

10. A semiconductor package comprising:
a dummy substrate having a top surface, a bottom surface opposite to the bottom surface, a first side surface, and a second side surface opposite to the first side surface;
a mold layer in direct contact with the first and second side surfaces and the top surface of the dummy substrate;
a stack structure comprising a semiconductor chip disposed on the dummy substrate, wherein the mold layer is disposed on first and second side surfaces of the stack structure; and
a redistribution line disposed on and electrically connected to the semiconductor chip.

11. The semiconductor package of claim 10, further comprising an adhesive layer disposed between the dummy substrate and the stack structure.

12. The semiconductor package of claim 10, further comprising an external terminal electrically connected to the redistribution line, wherein the external terminal is disposed above the mold layer.

13. The semiconductor package of claim 10, further comprising chip pads disposed between the redistribution line and the semiconductor chip.

14. The semiconductor package of claim 1, wherein the bottom surface of the mold layer is exposed by the dummy substrate.

* * * * *